United States Patent
Yang et al.

(10) Patent No.: US 8,971,122 B1
(45) Date of Patent: *Mar. 3, 2015

(54) GROUP BASED READ REFERENCE VOLTAGE MANAGEMENT IN FLASH MEMORY

(71) Applicant: Marvell International Ltd., Hamilton (BM)

(72) Inventors: Xueshi Yang, Cupertino, CA (US); Gregory Burd, San Jose, CA (US)

(73) Assignee: Marvell International Ltd. (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/191,589

(22) Filed: Feb. 27, 2014

Related U.S. Application Data

(63) Continuation of application No. 13/746,707, filed on Jan. 22, 2013, now Pat. No. 8,675,414, which is a continuation of application No. 13/017,430, filed on Jan. 31, 2011, now Pat. No. 8,363,478.

(60) Provisional application No. 61/305,487, filed on Feb. 17, 2010.

(51) Int. Cl.
*G11C 16/28* (2006.01)
*G11C 7/14* (2006.01)
*G11C 16/26* (2006.01)
*G11C 29/02* (2006.01)

(52) U.S. Cl.
CPC .............. *G11C 16/26* (2013.01); *G11C 29/028* (2013.01); *G11C 16/28* (2013.01); *G11C 2211/5634* (2013.01); *G11C 7/14* (2013.01)
USPC ............... 365/185.2; 365/185.24; 365/185.33

(58) Field of Classification Search
CPC .......... G11C 16/26; G11C 16/28; G11C 7/14; G11C 2211/5634; G11C 29/028
USPC ............................ 365/185.2, 185.24, 185.33
See application file for complete search history.

(56) References Cited

U.S. PATENT DOCUMENTS

| | | | |
|---|---|---|---|
| 6,246,621 B1* | 6/2001 | Miyamoto | 365/189.09 |
| 8,363,478 B1* | 1/2013 | Yang et al. | 365/185.2 |
| 8,675,414 B1* | 3/2014 | Yang et al. | 365/185.2 |
| 2005/0099874 A1* | 5/2005 | Shuto | 365/230.03 |
| 2006/0028872 A1* | 2/2006 | Rolandi et al. | 365/185.22 |
| 2008/0137407 A1 | 6/2008 | Wu et al. | |

(Continued)

*Primary Examiner* — Ly D Pham

(57) ABSTRACT

Apparatus, methods, and other embodiments associated with group based read reference voltage management in flash memory are described. According to one embodiment, an apparatus includes a partition logic, a $V_{ref}$ memory, and a $V_{ref}$ logic. The partition logic is configured to assign respective cells in a flash memory device to respective groups of cells. The $V_{ref}$ memory is configured to store respective $V_{ref}$ values mapped to respective groups of cells. The read logic is configured to read a cell in the flash memory by determining a group to which the cell is assigned; determining a $V_{ref}$ mapped to the group; and using the $V_{ref}$ value to read the cell. In one embodiment, the apparatus includes an adaptation logic configured to selectively adapt respective $V_{ref}$ values mapped to the respective groups of cells.

20 Claims, 7 Drawing Sheets

(56) References Cited

U.S. PATENT DOCUMENTS

| | | | |
|---|---|---|---|
| 2008/0279017 A1* | 11/2008 | Shimano et al. | 365/189.06 |
| 2011/0199823 A1 | 8/2011 | Bar-Or et al. | |
| 2012/0102259 A1 | 4/2012 | Goss et al. | |

* cited by examiner

GROUP BASED READ REFERENCE VOLTAGE MANAGEMENT IN FLASH MEMORY

CROSS REFERENCE TO RELATED APPLICATIONS

This disclosure is a continuation of U.S. application Ser. No. 13/746,707 filed on Jan. 22, 2013, now U.S. Pat. No. 8,675,414 which is a continuation of U.S. application Ser. No. 13/017,430 filed on Jan. 31, 2011 now U.S. Pat. No. 8,363,478 which claims benefit under 35 USC §119(e) to U.S. provisional application Ser. No. 61/305,487 filed on Feb. 17, 2010, which is hereby wholly incorporated by reference.

BACKGROUND

Flash memory is a type of memory used for non-volatile computer storage. Flash memory does not require power to maintain the information stored on the chip. However, over time, a charge distribution in cells in a flash memory may change. Therefore, a reference voltage ($V_{ref}$) used to read a value from a location in a flash memory whose charge distribution has changed may need to be changed. Changing $V_{ref}$ may facilitate avoiding complications from the shifting charge distribution. Charge stored in the flash memory cell directly affects the threshold voltage (Vth) of the cell. Subsequently, charge distribution change results in threshold voltage distribution change.

Flash memory stores information in an array of memory cells made from floating gate transistors. A single level cell (SLC) device stores one bit of information per cell while a multi-level cell (MLC) device stores more than one bit per cell. Flash memory stores data by programming the cell to different threshold voltage ($V_{th}$) values. In a one bit/cell flash (SLC), flash cells have two nominal $V_{th}$ while in a two bits/cell flash, cells have four nominal $V_{th}$ values. Both SLC and MLC devices may experience charge distribution shift and thus $V_{ref}$ adaptation may be desired for both types of devices. FIG. 1 illustrates charge distribution shifts in an SLC device. The solid lines labeled T1 illustrate the charge distribution before cycling and data retention while the dotted lines labeled T2 illustrate the charge distribution after cycling and data retention. FIG. 2 illustrates charge distribution shifts in an MLC device. Once again solid lines illustrate charge distribution before cycling and data retention and dotted lines illustrate charge distribution after cycling and data retention.

Data that originally was stored properly and read correctly may, over time, be susceptible to being read incorrectly due to the changing charge distribution. FIG. 3 illustrates an overlap between charge distributions. The overlap is the area where bit errors may be experienced due to charge distribution shift. Region E01 represents an area where a zero may be incorrectly read as a one and region E10 represents an area where a one may be incorrectly read as a zero. The position of $V_{ref}$ along with the Vth distributions will determine the regions E01 and E10.

Charge distributions are a function of factors including, but not limited to, program/erase (PE) cycling count, read operation times, and data retention time. Data retention time concerns how long it has been since a cell was programmed. Charge distribution is a function of data retention time due to charge leakage over time. Cells that were programmed at a similar time may benefit from using a similar $V_{ref}$ that is adapted to account for the data retention time. However, conventionally it has been difficult, if even possible at all, to store and/or use information concerning when a cell(s) was programmed.

Improved system performance can be achieved by minimizing decoding failures and unrecoverable sector errors. Tracking charge distribution and using an adapted corresponding $V_{ref}$ is one way to help achieve improved system performance. Blocks in flash memory devices may have similar PE cycling counts due to wear leveling. Therefore, the PE cycling count effect on charge distribution changes may be mitigated as $V_{ref}$ is adapted. During reads, the $V_{ref}$ for a cell or even a block of cells may be automatically adapted to track distribution charge shift. This automatic $V_{ref}$ adaptation for a cell(s) can also mitigate the PE cycling count effect on charge distribution drift.

SUMMARY

In general, in one aspect, this specification discloses an apparatus. The apparatus includes a partition logic, a $V_{ref}$ memory, and a $V_{ref}$ logic. The partition logic is configured to assign respective cells in a flash memory device to respective groups of cells. The $V_{ref}$ memory is configured to store respective $V_{ref}$ values mapped to respective groups of cells. The read logic is configured to read a cell in the flash memory by determining a group to which the cell is assigned; determining a $V_{ref}$ mapped to the group; and using the $V_{ref}$ value to read the cell.

In general, in another aspect, this specification discloses a method. The method includes determining that a first cell in a flash memory is assigned to a first group; determining a first $V_{ref}$ mapped to the first group; and using the first $V_{ref}$ value to read the first cell. The method also includes determining that a second cell in the flash memory is assigned to a second group; determining a second $V_{ref}$ mapped to the second group; and using the second $V_{ref}$ value to read the second cell. The first $V_{ref}$ and the second $V_{ref}$ are different.

In general, in another aspect, this specification discloses an apparatus. The apparatus includes a read logic and an adaptation logic. The read logic is configured to determine that a first cell in a flash memory is assigned to a first group; determine a first $V_{ref}$ mapped to the first group; and use the first $V_{ref}$ value to read the first cell. The read logic is configured to determine that a second cell in the flash memory is assigned to a second group; determine a second $V_{ref}$ mapped to the second group; and use the second $V_{ref}$ value to read the second cell. The first $V_{ref}$ and the second $V_{ref}$ are different. The adaptation logic is configured to selectively adapt respective $V_{ref}$ values mapped to the respective groups of cells.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
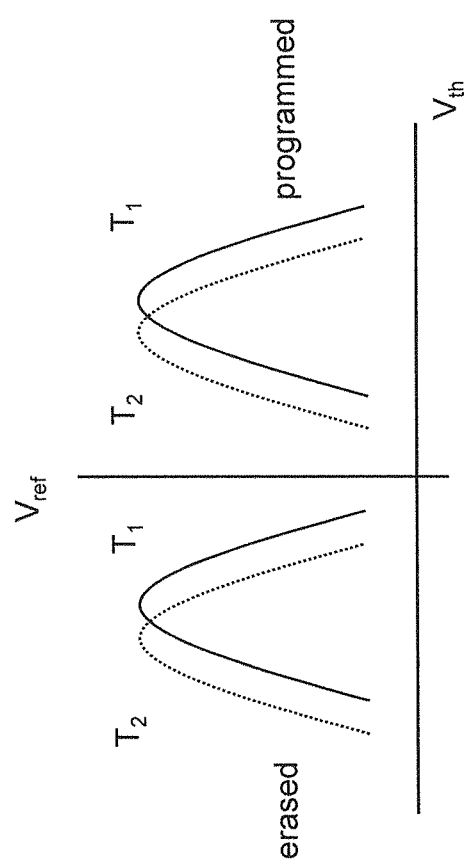
FIG. 1 illustrates charge distribution shifts in an SLC device.
Figure 2:
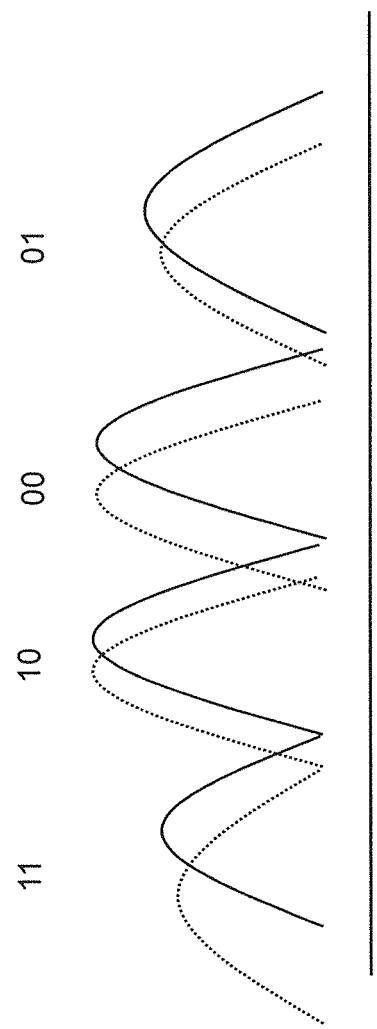
FIG. 2 illustrates charge distribution shifts in an MLC device.
Figure 3:
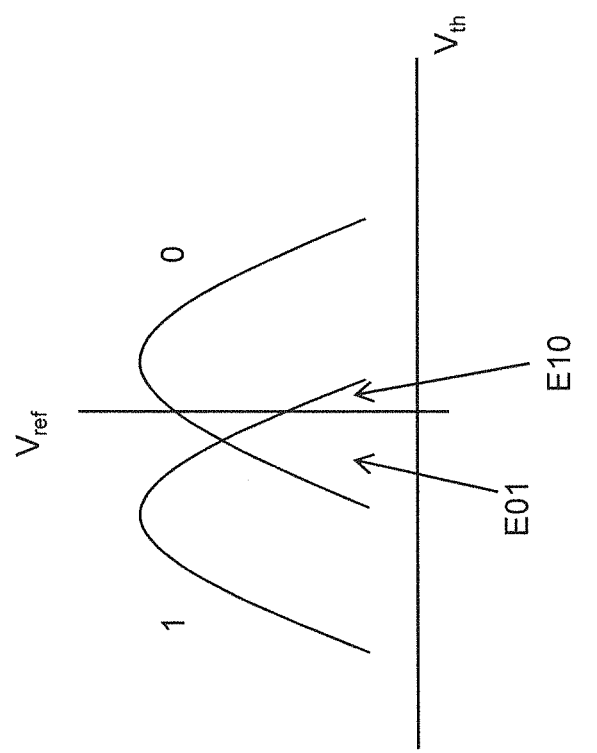
FIG. 3 illustrates an overlap between charge distributions caused by charge distribution shift.

Described herein are apparatuses, methods, and other embodiments associated with group based read reference voltage management in flash memory. Examples of apparatuses and methods mitigate charge distribution shift issues related to data retention time. Examples of apparatuses and methods group smaller collections of cells (e.g., individual cells, pages of cells, blocks of cells, wide erasable units (WERUs) of cells) into larger collections of cells that may be referred to as groups. The smaller collections are placed into the larger collections as a function of program time. Thus, members of a group have a similar programming time. A $V_{ref}$ adaptation value or vector is created and associated with an entire group. When a member of the group is accessed (e.g., read), the $V_{ref}$ adaptation value or vector is updated. Thus, even though an individual cell or smaller collection of cells may not have been accessed, the individual cell or smaller collection of cells may still have an up-to-date $V_{ref}$ value or vector because the $V_{ref}$ value or vector associated with the group may have been adapted when some other cell in the group that was programmed at a similar time was accessed. If a smaller collection of cells is re-programmed, then the smaller collection of cells has a new programming time and will be re-assigned to a different group having a similar programming time.

Tracking data retention time on a per cell basis or on any other basis is difficult because flash devices typically do not include a built-in clock or additional memory for storing timing information. Additionally, flash devices are regularly turned on and off, which complicates tracking time. Data in a flash memory device may be accessed at different rates. For example, "hot" data may be frequently accessed and thus may experience frequent $V_{ref}$ adaptations. Conversely, "cold" data may be infrequently accessed and thus may experience infrequent $V_{ref}$ adaptations. Even though both hot and cold data may have been programmed in a similar charge distribution shift time frame, in conventional systems, only the "hot" data would have a useful, current $V_{ref}$.

Thus, apparatuses and methods perform group based $V_{ref}$ tracking and management where "cold" data may benefit from $V_{ref}$ adaptations computed on-the-fly for "hot" data. In this way, cells that are programmed at a similar time can benefit from a similar $V_{ref}$ value, even if some of those cells have not been accessed. Non-accessed group members can benefit from $V_{ref}$ adaptations performed for accessed group members. A special case may exist when no member of the group is accessed within a relevant time frame.

Examples of apparatuses and methods rely on a timer. The timer is configured to identify different relative time intervals. Thus, the "timer" may not be a conventional clock, but rather may be an apparatus or logic (e.g., interval logic) configured to partition time into different timer intervals based on different criteria for defining a timer interval. The timer intervals may be defined, for example, by the passage of a certain amount of real time, by the passage of a certain amount of system clock time, by the passage of a threshold number of program/erase cycles, by the passage of a threshold number of read operations, by combinations thereof, and so on. With respect to data retention time, it is not necessary to know the precise wall clock time at which a cell was programmed. It is, however, valuable to be able to group cells that were programmed at a similar time. Therefore, examples of apparatuses and methods rely on a timer that is able to track timer intervals and to know what timer interval is currently active.

A cell that is programmed during a timer interval is grouped together with other cells that were programmed during that timer interval. By way of illustration, a cell that is programmed during a timer interval T1 is grouped with other cells that were programmed during timer interval T1 while a cell that is programmed during a timer interval T2 is grouped with other cells that were programmed during timer interval T2. A first group $V_{ref}$ value may be maintained for the group associated with T1 and a second, different group $V_{ref}$ value may be maintained for the group associated with T2. When a member of the group associated with T1 is accessed, the first group $V_{ref}$ value may be adapted. Similarly, when a member of the group associated with T2 is accessed, the second group $V_{ref}$ value may be adapted. When a member of the first group is reprogrammed, the member may be re-assigned to another group that is related to a current timer interval.

Figure 4:
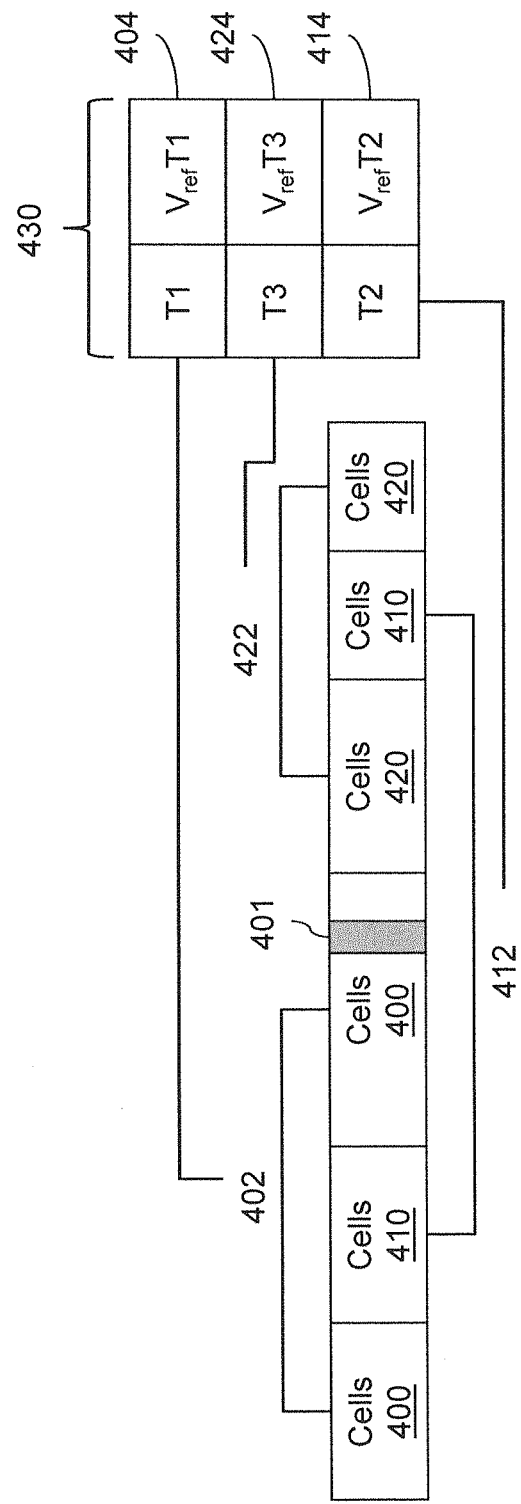
FIG. 4 illustrates groups of cells associated with group $V_{ref}$ values.

FIG. 4 illustrates grouping cells programmed at similar times into groups and associating $V_{ref}$ values or vectors with groups. A first collection of cells 400 are programmed during the same timer interval T1 and thus are placed into group 402. Note that the first collection of cells 400 need not be contiguous cells in a flash memory device. Indeed, in one example the first collection of cells 400 may even be distributed across more than one flash memory device. A second collection of cells 410 are programmed during the same timer interval T2 and thus are placed into group 412. A third collection of cells 420 are programmed during the same timer interval T3 and thus are placed into group 422. Group 402 and interval T1 are associated with a $V_{ref}$ adaptation value 404. Similarly, group 412 and interval T2 are associated with a $V_{ref}$ adaptation value 414 and group 422 and interval T3 are associated with a $V_{ref}$ adaptation value 424.

Consider a small group of cells 401 that are in the collection 400 of cells. The small group of cells 401 was initially programmed during timer interval T1. Then the small group of cells 401 was reprogrammed during time interval T3. Examples of apparatus and methods would reassign cells 401 from group 402 to group 422. The re-assignment may be achieved logically rather than physically by manipulating associations in memory 430 or by manipulating associations relevant to memory 430. If one member of group 402 is accessed, then the $V_{ref}$ 404 associated with group 402 is adapted and the other members of group 402 have an up-to-date $V_{ref}$ value. Similarly, if a cell associated with group 412 is accessed, then the $V_{ref}$ 414 associated with group 412 is adapted and if a cell associated with group 422 is accessed then the $V_{ref}$ 424 associated with group 422 is adapted. The different $V_{ref}$ values (e.g., 404, 414, 424) may be stored in a memory 430. In one embodiment, memory 430 may be indexed by timer interval.

In one embodiment, memory 430 may be located in a flash memory device(s) for which group based read reference voltage management is provided. In another embodiment, memory 430 may be located in a separate memory. In different embodiments, memory 430 may be organized as an indexed table, as a linked list, or in other logical forms. Thus, the physical requirements for memory 430 are that memory 430 be able to persistently store $V_{ref}$ values for groups of cells. The logical requirements for memory 430 are that memory 430 be able to store $V_{ref}$ values for groups of cells in a manner where they can be accessed based on group membership.

Examples of apparatuses and methods form groups as a function of programming time. Individual groups share a $V_{ref}$ vector. There may be M groups (e.g., M=64, M=256, M=1024). When a member of the group is accessed, the shared $V_{ref}$ vector is adapted. When a member of the group is reprogrammed, the member may be reassigned to a different group based on the reprogramming time. In one embodiment, there may be a one to one correspondence between the number of groups M and the number of time intervals through which the timer will cycle. In another embodiment, there may not be a one to one correspondence between the number of groups M and the number of time intervals. Over a period of time, the timer may cycle through a finite set of index values and return to a previously unused index.

Examples of apparatuses and methods may partition time in different ways. In one example, the timer interval may tick over after an internal clock detects the passage of a threshold period of time. In another example, the timer interval may tick over after a threshold number of programming operations have been performed. In yet another example, the timer interval may tick over after a threshold number of read operations have been performed. In one example, the timer interval may tick over after a defined period of time (e.g., 8640 minutes=10 days). However, flash memory devices may be turned off and left powered down for lengthy periods of time. Without some additional technique, the timer may never count the 8640 minutes. Therefore, in one example, the timer may also be configured to tick over to a new timer interval when the flash device is powered up. In another example, the timer may be configured to count a defined period of time or a defined number of program operations or a defined number of read operations when the flash memory device is powered up. Thus the timer may, more generally, be considered to be a time interval logic that somehow partitions time into a finite set of timer intervals.

Cells may initially be assigned to groups at times including, but not limited to, manufacture time, installation time, and initialization time. Cells are reassigned when they are reprogrammed. The $V_{ref}$ for a group is recomputed when a group member is read. However, it is possible that no group member is read during a period of time that is so long that the timer cycles all the way through the finite set of discrete timer intervals (e.g., 0 to M−1). If the timer has cycled all the way through to the point where an index for a group is about to be re-assigned and the group has not had its $V_{ref}$ updated, then the group may be designated for additional processing. In one example, the group may be assigned a special index (e.g., S=M+1). Cells assigned to the group with the special index may receive additional processing to adapt $V_{ref}$ and to re-assign the cells to a group.

Even with group based $V_{ref}$ management, a $V_{ref}$ value may still yield errors. In this example, a subsequent access to cold data may yield errors. In one embodiment, if repeated retries or ECC decoding failures are produced by reading using the $V_{ref}$ for a group, then the $V_{ref}$ vector may be calibrated using an additional method. The additional method may include, for example, examining charge distribution for a sample subset of members of the group and then adapting the $V_{ref}$ vector for the whole group based on the charge distribution discovered for the sample subset. Examining the charge distribution for the sample subset may include, for example, performing dedicated repetitive read operations to understand the charge distribution.

The $V_{ref}$ value may be adapted using different approaches. In one example, a delta for the $V_{ref}$ is computed according to:

$$\Delta = \beta(e_{0 \to 1} - e_{1 \to 0})$$

where
  $\beta$ is a constant,
  $e_{0 \to 1}$ is a number of zero to one errors, and
  $e_{1 \to 0}$ is a number of one to zero errors.
The number of zero to one errors is identified by determining how many zero values were incorrectly read as one values. Similarly, the number of one to zero errors is identified by determining how many one values were incorrectly read as zero values. Parity checking apparatus may facilitate making these determinations.

Figure 5:
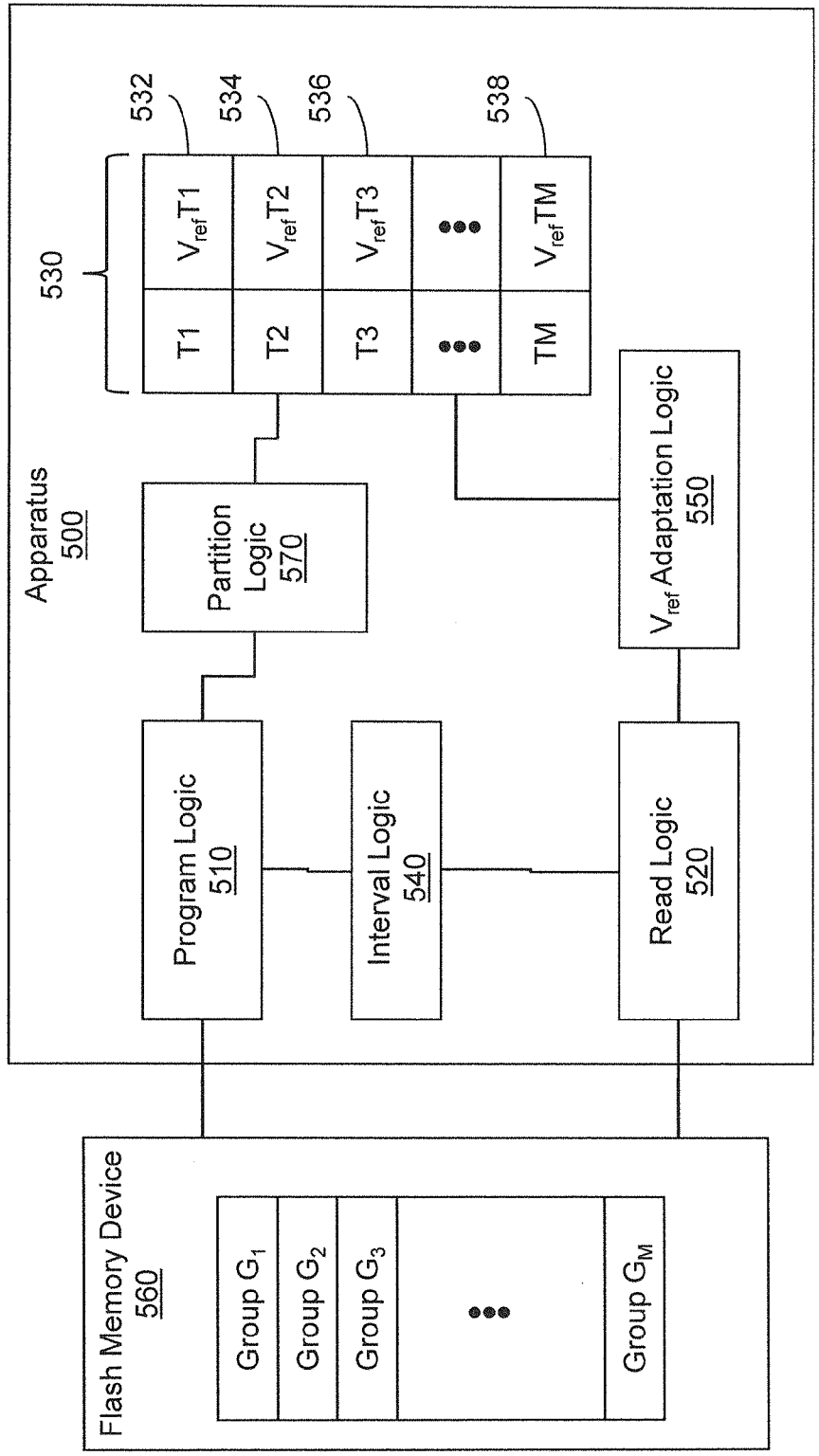
FIG. 5 illustrates an apparatus associated with group based read reference voltage management in flash memory.

FIG. 5 illustrates an apparatus 500 that is configured to perform group based read reference voltage management for a flash memory device 560. Apparatus 500 includes a program logic 510, a read logic 520, a $V_{ref}$ memory 530, an interval logic 540, a $V_{ref}$ adaptation logic 550, and a partition logic 570. The flash memory device 560 has its cells partitioned into groups $G_1$ through $G_M$. In FIG. 5, there is a one to one correspondence between the number of timer intervals M, the number of entries in the $V_{ref}$ memory 530, and the number of groups $G_1$ through $G_M$. In other embodiments, there may not be a one to one correspondence.

The program logic 510 is configured to program cells in flash memory device 560. The program logic 510 is configured to initially program cells and to reprogram cells. The interval logic 540 is configured to cycle through a finite set of time intervals. Cells that are programmed during a single time interval are grouped together logically. A relationship between a group and an entry in the $V_{ref}$ memory 530 is established by indexing the $V_{ref}$ memory 530 using the group number. The group number may correspond to the current timer interval in the interval logic 540.

The read logic 520 is configured to read cells in flash memory device 560. When a cell is read, the $V_{ref}$ value in $V_{ref}$ memory 530 that corresponds to the group the cell belongs to is used for read operation and subsequently may be adapted. The adaptation is performed by $V_{ref}$ adaptation logic 550.

The interval logic 540 may partition time into timer intervals using different approaches. In one embodiment, time is partitioned with reference to clock ticks. In other embodiments, time may be partitioned with reference to program cycles performed by the program logic 510, with reference to read operations performed by the read logic 520, with reference to a combination of program operations and read operations, or with reference to other criteria. Thus, the timer intervals may represent different items. In different examples, the timer interval may be defined by one or more of, a discrete amount of time, a number of program operations, a number of read operations, or a combination thereof. In different examples, there may be a one to one correspondence between the number of discrete timer intervals, the number of groups, and the number of $V_{ref}$ entries in the $V_{ref}$ memory.

The partition logic 570 is configured to maintain a relationship between a group of cells in the flash memory device 560 and a $V_{ref}$ value in the $V_{ref}$ memory 530. The relationship is determined, at least in part, by a timer interval during which the program logic 510 programmed the group of cells. In one embodiment, the partition logic 570 may be further configured to establish the initial relationship between a group of cells and a $V_{ref}$ value in the $V_{ref}$ memory. In other embodiments, the initial relationships between groups and $V_{ref}$ values may be established at flash memory device manufacture time, at flash memory device installation time, at flash memory device initiation time, and at other times.

In one embodiment, program logic 510 is configured to program a cell in flash memory device 560 and read logic 520 is configured to read a cell in the flash memory device 560. The $V_{ref}$ memory 530 is configured to store $V_{ref}$ values to be used to by the read logic 520 to read cells in the flash memory device 560. The $V_{ref}$ adaptation logic 550 is configured to selectively adapt a $V_{ref}$ value in the $V_{ref}$ memory 530. The interval logic 540 is configured to partition time into a finite set of timer intervals, to maintain a current timer interval, and to cycle the current timer interval through the finite set of timer intervals. The partition logic 570 is configured to maintain a relationship between a group of cells in the flash memory device 560 and a $V_{ref}$ value in the $V_{ref}$ memory 530. The relationship is determined, at least in part, by a timer interval during which the program logic 510 programmed the group of cells.

In one embodiment, the partition logic 570 is configured to selectively move a cell from a first group associated with a first time and timer interval during which the cell was previously programmed to a second group associated with a current time and timer interval during which the cell is re-programmed.

In one embodiment, the $V_{ref}$ adaptation logic 550 is configured to adapt the $V_{ref}$ value upon determining that a read operation occurred. In one embodiment, the $V_{ref}$ adaptation logic 550 is configured to adapt the $V_{ref}$ value upon determining that a threshold number of ECC errors and/or group retries has occurred while reading the flash memory device 560. In another embodiment, the $V_{ref}$ adaptation logic 550 is configured to adapt the $V_{ref}$ value upon determining that the $V_{ref}$ value has not been updated in a pre-defined period of time. The $V_{ref}$ adaptation logic 550 may be configured to adapt the $V_{ref}$ for a group as a function of analyzing the charge distribution for a subset of members of the group. The $V_{ref}$ adaptation logic 550 may be configured to adapt the $V_{ref}$ by a delta $V_{ref}$ amount according to:

$$\Delta = \beta(e_{0 \to 1} - e_{1 \to 0})$$

where
β is a constant,
$e_{0 \to 1}$ is a number of zero to one errors, and
$e_{1 \to 0}$ is a number of one to zero errors.

Apparatus 500 is illustrated external to flash memory device 560. In one embodiment, apparatus 500 may reside in and/or be incorporated into flash memory device 560.

Figure 6:
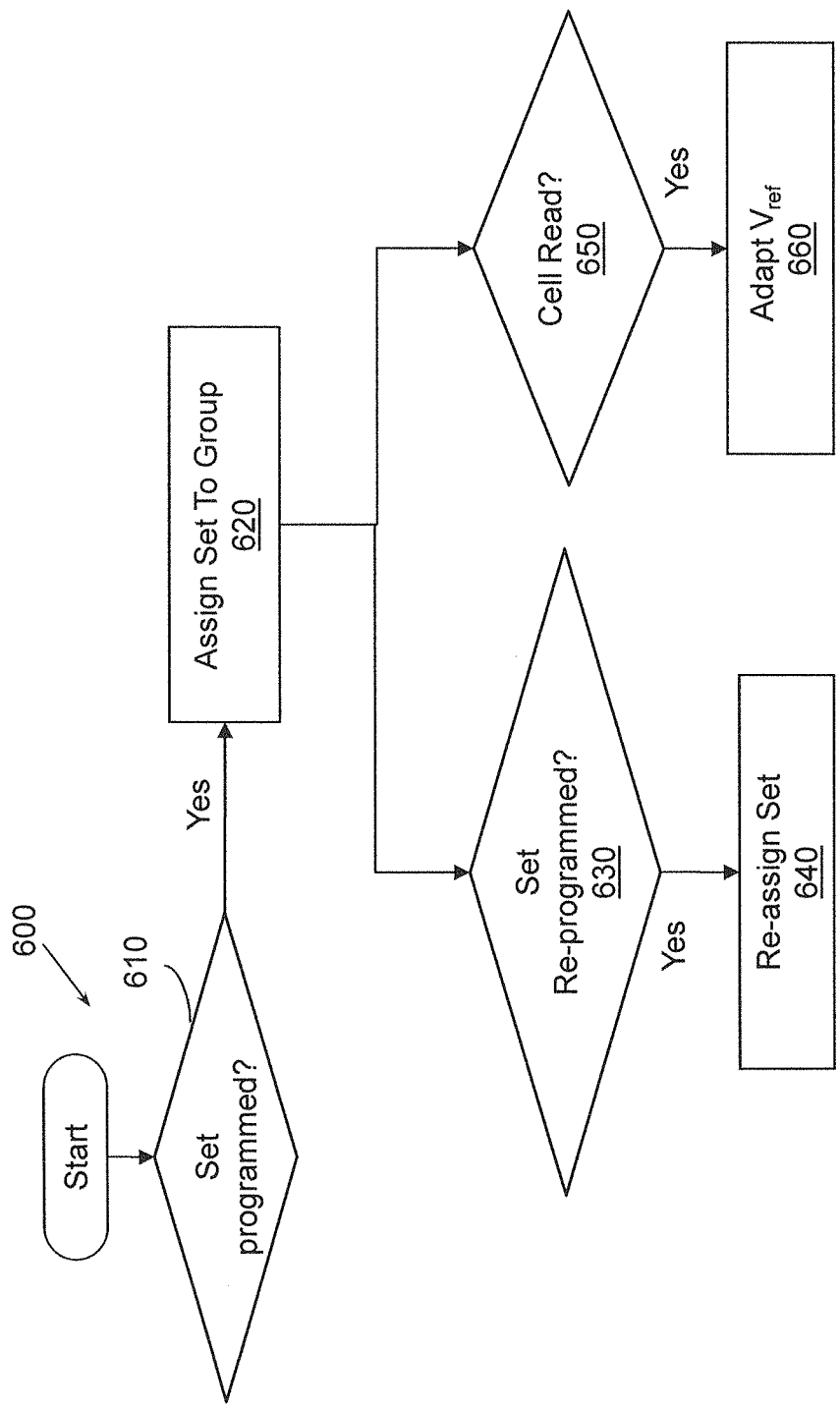
FIG. 6 illustrates a method associated with group based read reference voltage management in flash memory.

FIG. 6 illustrates a method 600 associated with group based read reference voltage adaptation processing. At 610, a determination is made concerning whether a WERU has been programmed. If a WERU has been programmed, then at 620 the WERU of cells is assigned to a first group of cells based on a time interval during which the WERU was programmed. Assigning the WERU of cells to the first group of cells may include, for example, creating a relationship between the WERU and an indexed or otherwise addressable memory or data structure. For example, the WERU may be assigned an array index where the corresponding array entry stores a group $V_{ref}$.

At 630, a determination is made concerning whether the WERU has been re-programmed. If the WERU has been re-programmed, then at 640 the WERU is re-assigned to a second different group of cells based on a time interval during which the WERU was re-programmed. Re-assigning the WERU may include, for example, assigning a different array index to the WERU. While arrays and array indices are discussed, other data structures and addressing schemes may be employed.

At 650, a determination is made concerning whether a cell has been read. If the cell has been read, then at 660 the $V_{ref}$ for a group of WERUs associated with the cell is selectively adapted. The $V_{ref}$ may also be adapted for a group of WERUs upon determining that the group has experienced more than a threshold amount of retries and/or ECC errors.

The actions illustrated at 630 through 660 may be repeated and, in different examples, may be performed in a single thread or in multiple threads.

The method 600 may also include establishing a finite set of timer intervals. A timer interval may represent a discrete amount of time, a number of program operations, a number of read operations, and/or a combination of time, program operations, and read operations. With the timer intervals defined, the method 600 may also include establishing a corresponding finite set of $V_{ref}$ values, establishing a corresponding finite set of groups into which a WERU can be placed, and establishing a relationship between a member of the finite set of timer intervals, a member of the finite set of groups, and a member of the finite set of $V_{ref}$ values. With the relationships established, the method 600 may include selectively reassigning a WERU to a different group upon determining that a $V_{ref}$ value corresponding to the WERU has not been adapted during a period of time equaling the sum of the finite set of timer intervals.

Figure 7:
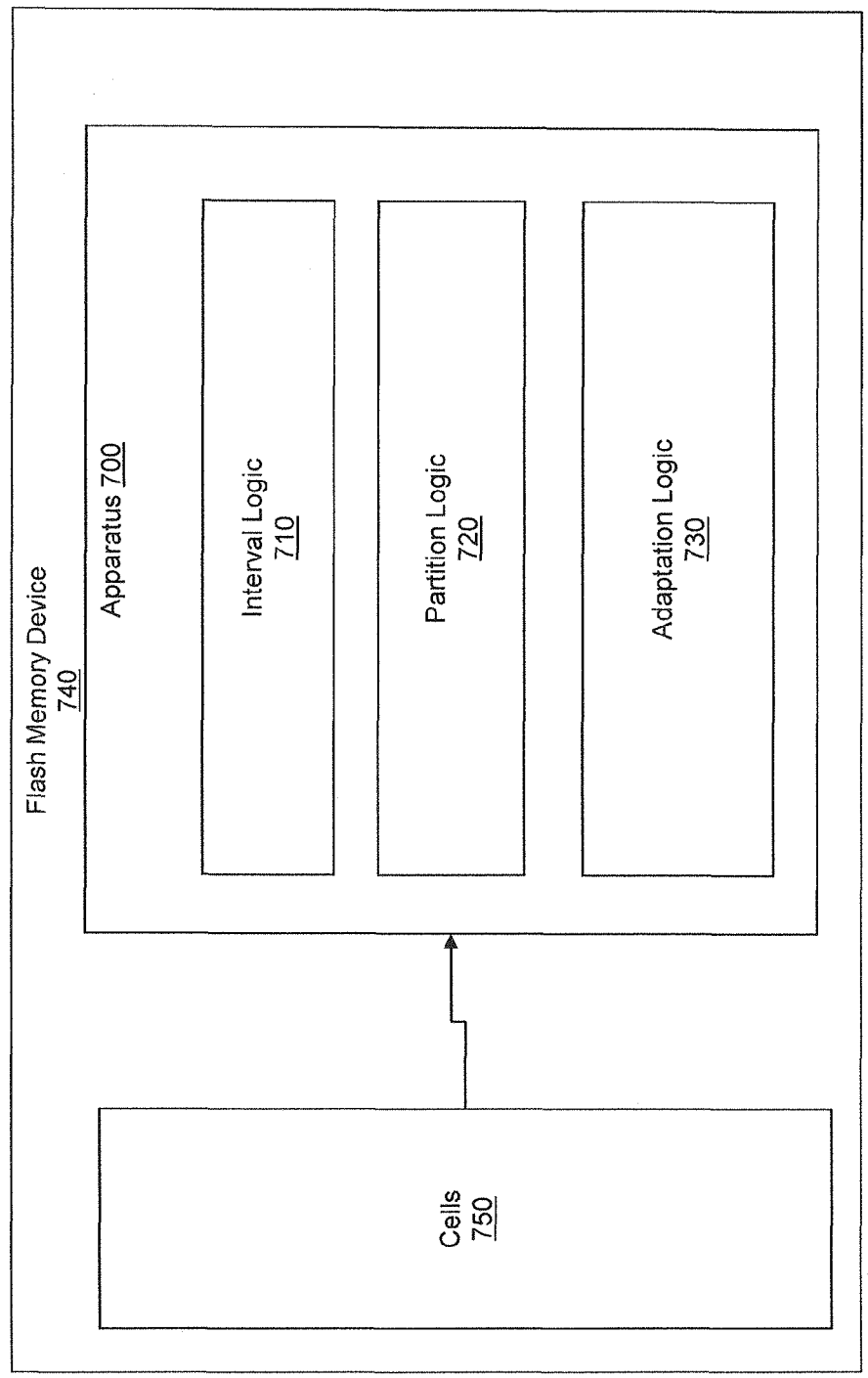
FIG. 7 illustrates an apparatus associated with group based read reference voltage management in flash memory.

FIG. 7 illustrates an apparatus 700. Apparatus 700 includes an interval logic 710, a partition logic 720, and an adaptation logic 730. The apparatus 700 is configured to provide group based read reference voltage management for flash memory device 740. Flash memory device 740 has a number of cells 750. While a single flash memory device 740 is illustrated, apparatus 700 may provide group based read reference voltage management for more than one flash memory device.

The interval logic 710 is configured to create a finite set of timer intervals. The partition logic 720 is configured to selectively assign a $V_{ref}$ value to a set of flash memory cells as a function of a timer interval during which the set of flash memory cells are programmed. The partition logic 720 is also configured to selectively assign a different $V_{ref}$ value to a set of flash memory cells as a function of a timer interval during which the set of flash memory cells are re-programmed.

The adaptation logic 730 is configured to selectively adapt a $V_{ref}$ value associated with a flash memory cell upon determining that the flash memory cell has been read. The adaptation logic 730 may also be configured to selectively adapt a $V_{ref}$ value associated with a set of flash memory cells upon determining that the $V_{ref}$ value associated with the set of flash memory cells has not been adapted during a period of time equaling the sum of the finite set of timer intervals.

Apparatus 700 may also include a memory configured to store $V_{ref}$ values and to store associations between $V_{ref}$ values and flash memory cells 750. The memory may be located in the flash memory cells 750. Apparatus 700 is illustrated being inside flash memory device 740. In one embodiment, the apparatus 700 may be external to flash memory device 740.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, a non-transitory medium with stored instructions or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

Previous Disclaimers Rescinded

Applicant respectfully informs the Patent Office that the present disclosure is a broadening continuation. Applicant rescinds all disclaimers made during the prosecution of the parent application(s), which may have included statements or amendments that may have disclaimed scope. Accordingly, the previous disclaimers, and the prior art that it was made to avoid, may need to be and should be re-visited.

What is claimed is:

1. An apparatus, comprising:
    a partition logic configured to assign respective cells in a flash memory device to respective groups of cells;
    a $V_{ref}$ memory configured to store respective $V_{ref}$ values mapped to respective groups of cells;
    a read logic configured to read a cell in the flash memory by:
        determining a group to which the cell is assigned;
        determining a $V_{ref}$ mapped to the group; and
        using the $V_{ref}$ value to read the cell; and
    wherein the partition logic is further configured to re-assign a cell to a different group when the cell is reprogrammed.

2. The apparatus of claim 1, wherein the partition logic is configured to assign respective cells to respective groups based, at least in part, on a time at which the respective cells are programmed.

3. The apparatus of claim 2, further comprising an interval logic configured to produce a set of time intervals, to maintain a current time interval, and to cycle the current time interval through the set of time intervals, and wherein the partition logic is configured to assign respective cells to respective groups based, at least in part, on a current time interval during which respective cells are programmed.

4. The apparatus of claim 3, wherein the partition logic is further configured to, when a cell from a first group associated with a first time interval is re-programmed during a second time interval, selectively assign the cell to a second group associated with the second time interval.

5. The apparatus of claim 3, wherein a time interval represents one or more of, a discrete amount of time, a number of program operations, and a number of read operations.

6. The apparatus of claim 1, wherein the partition logic is further configured to assign respective cells to respective groups of cells based, at least in part, on one or more of a manufacture time, an installation time, and an initialization time.

7. The apparatus of claim 1, further comprising a $V_{ref}$ adaptation logic configured to selectively adapt a $V_{ref}$ value for a given group of cells in the $V_{ref}$ memory.

8. The apparatus of claim 7, wherein the $V_{ref}$ adaptation logic is configured to adapt a $V_{ref}$ value for a given group of cells when a read operation is performed on a cell in the given group of cells.

9. The apparatus of claim 7, wherein the $V_{ref}$ adaptation logic is configured to adapt the $V_{ref}$ value upon determining that a threshold number of one or more of, ECC errors, and group retries, has occurred while reading the flash memory device.

10. The apparatus of claim 7, wherein the $V_{ref}$ adaptation logic is configured to adapt the $V_{ref}$ value upon determining that the $V_{ref}$ value has not been updated in a pre-defined period of time.

11. A method, comprising:
    determining that a first cell in a flash memory is assigned to a first group;
    determining a first $V_{ref}$ mapped to the first group;
    using the first $V_{ref}$ value to read the first cell;
    determining that a second cell in the flash memory is assigned to a second group;
    determining a second $V_{ref}$ mapped to the second group;
    using the second $V_{ref}$ value to read the second cell; and
    wherein the first $V_{ref}$ and the second $V_{ref}$ are different;
    determining that the first cell has been reprogrammed;
    assigning the first cell to a third group to which is mapped a third $V_{ref}$, wherein (i) the third group different from the first group and (ii) the third $V_{ref}$ is different from the first $V_{ref}$.

12. The method of claim 11, further comprising:
    adapting the first $V_{ref}$ upon determining that the first group of cells has experienced more than a threshold amount of one or more of, retries, and ECC errors.

13. The method of claim 11, further comprising assigning respective cells to respective groups of cells based on respective time intervals during which respective cells were programmed.

14. The method of claim 13, further comprising:
during a second time interval, re-programming a cell assigned to the first group during a first time interval; and
re-assigning the cell to a third different group comprising cells programmed during the second time interval.

15. The method of claim 13, wherein a time interval represents one or more of, a discrete amount of time, a pre-defined number of program operations, a pre-defined number of read operations, and a combination of a discrete amount of time, a pre-defined number of program operations, and a pre-defined number of read operations.

16. An apparatus, comprising:
a read logic configured to:
determine that a first cell in a flash memory is assigned to a first group;
determine a first $V_{ref}$ mapped to the first group;
use the first $V_{ref}$ value to read the first cell;
determine that a second cell in the flash memory is assigned to a second group;
determine a second $V_{ref}$ mapped to the second group;
use the second $V_{ref}$ value to read the second cell; and
where the first $V_{ref}$ and the second $V_{ref}$ are different;
an adaptation logic configured to selectively adapt respective $V_{ref}$ values mapped to the respective groups of cells; and
partition logic configured to:
determine that the first cell has been reprogrammed; and
assign the first cell to a third group to which is mapped a third $V_{ref}$, wherein (i) the third group is different from the first group and (ii) the third $V_{ref}$ is different from the first $V_{ref}$.

17. The apparatus of claim 16, wherein the adaptation logic is configured to selectively adapt a $V_{ref}$ value for a group of cells based, at least in part, on one or more errors that occur when one or more cells in the group of cells are read by the read logic.

18. The apparatus of claim 16, wherein the adaptation logic is configured to adapt a $V_{ref}$ value upon determining that the group of cells mapped to the $V_{ref}$ value has experienced more than a threshold amount of one or more of, retries, and ECC errors.

19. The apparatus of claim 16, further comprising a partition logic configured to assign cells to groups of cells based on respective time intervals during which respective cells were programmed.

20. The apparatus of claim 19, wherein the partition logic is further configured to:
determine that a cell assigned to a given group programmed during a first time interval has been reprogrammed during a second time interval; and
re-assign the cell to a different group of cells programmed during the second time interval.

* * * * *